United States Patent
Katayose

(10) Patent No.: US 6,718,531 B2
(45) Date of Patent: Apr. 6, 2004

(54) METHOD OF DESIGNING INTEGRATED CIRCUIT USING HIERARCHICAL DESIGN TECHNIQUE

(75) Inventor: Yuuji Katayose, Tokyo (JP)

(73) Assignee: NEC Electronics Corporation (JP)

(*) Notice: Subject to any disclaimer, the term of this patent is extended or adjusted under 35 U.S.C. 154(b) by 0 days.

(21) Appl. No.: 10/136,414

(22) Filed: May 1, 2002

(65) Prior Publication Data

US 2002/0170026 A1 Nov. 14, 2002

(30) Foreign Application Priority Data

May 10, 2001 (JP) ........................ 2001-140774

(51) Int. Cl.$^7$ .............................................. G06F 17/50
(52) U.S. Cl. ................... 716/10; 716/8; 716/9; 716/11
(58) Field of Search ................. 716/1, 4–6, 8–11, 716/18; 703/19

(56) References Cited

U.S. PATENT DOCUMENTS

| | | | | |
|---|---|---|---|---|
| 5,572,437 A | * | 11/1996 | Rostoker et al. | 716/8 |
| 5,880,971 A | * | 3/1999 | Dangelo et al. | 716/6 |
| 5,956,497 A | * | 9/1999 | Ratzel et al. | 716/1 |
| 6,493,660 B2 | * | 12/2002 | Saito | 703/19 |
| 6,546,541 B1 | * | 4/2003 | Petranovic et al. | 716/18 |
| 6,564,361 B1 | * | 5/2003 | Zolotykh et al. | 716/8 |

FOREIGN PATENT DOCUMENTS

JP 2980316 9/1999

OTHER PUBLICATIONS

T. Sakurai, "Approximation of Wiring Delay in MOSFETT LSI", IEEE Journal of Solid–State Circuits, vol. SC–18, No. 4, Aug. 1983.*
Brasen et al., "Post Placement Buffer Reoptimization", 1992, IEEE.*
A. Ginetti et al., Modifying the Netlist After Placement for Performance Improvement, IEEE Proceedings of the 1993 Custom Integrated Circuits Conference, p. 9.2.1–9.2.4, Mar. 1993.*
Lu et al., Combining Technology Mapping with Post–placement Resynthesis for Performance Optimization, International COnfernece on Computer Design: VLSI in Computers and Processors, pp. 616–621, Oct. 1998.*

* cited by examiner

Primary Examiner—Vuthe Siek
Assistant Examiner—Naum Levin
(74) Attorney, Agent, or Firm—Hayes Soloway P.C.

(57) ABSTRACT

A method of designing a layout of an integrated circuit is composed of providing a macro in which a macro circuit is to be accommodated in a top level hierarchical cell; and determining a layout of an interconnecting path provided on the top level hierarchical cell. The interconnecting path is used for transmitting a signal from a first position located outside the macro to a second position located outside the macro such that the interconnecting path passes through the macro. The interconnecting path includes first and second buffers placed substantially on a boundary of the macro, a first interconnection connecting the first position to an input of the first buffer, and a second interconnection connecting an output of the second buffer to the second position. An output of the first buffer is electrically connected to an input of the second buffer.

13 Claims, 12 Drawing Sheets

DIRECTION OF SIGNAL TRANSMISSION

METHOD OF DESIGNING INTEGRATED CIRCUIT USING HIERARCHICAL DESIGN TECHNIQUE

BACKGROUND OF THE INVENTION

1. Field of the Invention

The present invention relates to a method for designing integrated circuits. More particularly, the present invention relates to a method for designing integrated circuits using a hierarchical design technique.

2. Description of the Related Art

A hierarchical design technique is widely used for designing integrated circuits. The hierarchical design effectively improves efficiency of the design of the integrate circuits.

A hierarchical layout method is disclosed in Japanese Patent No. 2980316. As shown in FIG. 1A, the hierarchical design method begins with floor planning of a top-level hierarchical cell (top-level layer). As a result, macros 101a, 101b and 101c and an interconnecting path 102 are incorporated in the top-level hierarchical cell. The interconnecting path 102 is used for transmitting a signal from the macro 101a to the macro 101c. The interconnecting path 102 is designed so as to pass through the macro 101a.

The interconnecting path 102 is composed of interconnections 103, 104 and a repeater buffer 105. The repeater buffer 105 reduces a delay taken for a signal to be transmitted from the macro 101a to the macro 101c.

As shown in FIG. 1B, the macro level design data (or low-level design data) representative of a layout of macros (or low-level hierarchical cells) is then generated from a top-level design data representative of the layout of the top-level hierarchical cell. In the example shown in FIG. 1B, the macro level design data representative of the layout of the macro 101b is generated from the top-level design data.

The process of the generation of the macro level design data is described below. At first, virtual terminals 106b, 106c are generated at intersections of the interconnections 103, 104 and the boundary of the macro 101b, respectively. The interconnection 103 is divided into an interconnection 103a and an interconnection 103b by the virtual terminal 106b. Similarly, the interconnection 104 is divided into an interconnection 104a and an interconnection 104b by the virtual terminal 106c. The information representative of the arrangements of the interconnection 103a and the interconnection 104a, which are located outside the macro 101b, is left in the top-level design data. On the other hand, the information representative of the arrangements of the interconnection 103b, the interconnection 104b, and the repeater buffer 105, which are located inside the macro 101b, is separated from the top-level design data and embedded into the macro level design data.

Next, the layouts of the interconnections 103b, 104b are modified to optically determined the layout inside the macro 101b on the basis of the macro level design data. The positions of the virtual terminals 106b, 106c and the repeater buffer 105 are not changed by the modification of the layouts.

In the conventional hierarchical design method, the interconnecting path is determined so as to pass through the macro 101b, and the interconnecting path is further embedded in the macro 101b when the macro is designed. This prevents the interconnecting path of the top-level hierarchical cell from taking a long way around the macro 101b, and thus reduces the delay of the interconnecting path of the top-level hierarchical cell.

However, the conventional hierarchical design method requires a merge of the top-level design data and the macro level design data before a timing analysis, because the typical timing analysis tool does not comply with the timing analysis of the LSIs by the conventional hierarchical design method. The necessity of the merge of the top-level design data and the macro level design data reduces the merit of concurrent layout designs of a plurality of hierarchical levels.

With reference to FIG. 2, a typical timing analysis tool requests the provisions of data representative of:

the waveform rounding parameter of an input signal to an input terminal 202;

the resistance of an interconnection connected to an output terminal 203 from which an output signal is outputted; and the load capacitance of the output terminal 203. Here, the waveform rounding parameter implies the time taken for the input signal to rise up from a Low-level to a High level, or to trail from the High level to the Low-level. Typically, the time required for the input signal to rise from 10% of the High level to 90%, or to trail from 90% of the High level to 10% is used for representing the waveform rounding parameter. A delay of the macro is calculated during the timing analysis on the basis of the waveform rounding parameter of the input signal, the resistance of the interconnection connected to the output terminal, and the load capacitance of the output terminal.

The process of calculating a delay of a buffer included in the macro by a typical timing analysis tool is as follows. With reference to FIG. 3, let us suppose that the macro 201 includes a buffer 204 and an interconnection 205 connected to an output terminal of the buffer 204. The typical timing analysis tool calculates a delay $T_g$ of the buffer 204 by the equation (1):

$$T_g = f_1(T_{rf}, R, C+C_{in}), \quad (1)$$

where $f_1$ is a predetermined function, $T_{rf}$ is the waveform rounding parameter at the input terminal of the buffer 204, R is the resistance of the interconnection 205 connected to the output terminal of the buffer 204, C is the capacitance of the interconnection 205, and $C_{in}$ is the capacitance of an input terminal of another cell 206 to which the interconnection 205 is connected.

In addition, the typical timing analysis tool calculates a delay $T_w$ of the interconnection 205 by the equation (2):

$$T_w = f_2(R, C+C_{in}) + T_{rf}, \quad (2)$$

where $T_{rf'}$ is the waveform rounding parameter at the input terminal of the cell 206. The waveform rounding parameter $T_{rf'}$ is calculated by the equation (3):

$$T_{rf'} = f_3(D, R, C+C_{in}), \quad (3)$$

where D is a driving ability of the buffer 204 for outputting a signal to the interconnection 205.

With reference to FIG. 4, let us consider the case when the timing analysis is performed with respect to the macro 101b embedded in a LSI designed by the conventional hierarchical design method.

A delay T taken for a signal to be transmitted from a virtual terminal 106b to a virtual terminal 106c is given by:

$$T = T_{w1} + T_{g1} + T_{w2},$$

where $T_{w1}$ is a delay of the interconnection 103b, $T_{g1}$ is a delay of the repeater buffer 105, and $T_{w2}$ is a delay of the interconnection 104b.

From the equation (2), the delay $T_{w1}$ is given by:

$$T_{w1}=f_2(R_2, C_2+C_{in1})+T_{rf1},$$

where $R_2$ is the interconnection resistance of the interconnection 103b, $C_2$ is the interconnection capacitance of the interconnection 103b, $C_{in1}$ is the capacitance of the input terminal of the repeater buffer 105, and $T_{rf1}$ is the waveform rounding parameter at the input terminal of the repeater buffer 105.

The waveform rounding parameter $T_{rf1}$ can not be calculated by using the typical timing analysis tool, because the typical timing analysis tool does not have the function of receiving all parameters required to calculate the waveform rounding parameter $T_{rf1}$. The waveform rounding parameter $T_{rf1}$ is given by the equation (3) as follows:

$$T_{rf1}=f_3(D_1, R_1+R_2, C_1+C_2+C_{in1}),$$

where $D_1$ is the driving ability of a buffer 101a for outputting an input signal to the virtual terminal 106b, $R_1$ is the resistance of the interconnection 103a connected to the virtual terminal 106b, $C_1$ is the capacitance of the interconnection 103a. The typical timing analysis tool has the function of receiving the waveform rounding parameter of the input terminal to the virtual terminal 106b. However, the typical timing analysis tool does not have the function of receiving the driving ability $D_1$, the interconnection resistance $R_1$ and the interconnection capacitance $C_1$, which are required to calculate the waveform rounding parameter $T_{rf1}$.

Since the waveform rounding parameter $T_{rf1}$ can not be calculated, it is impossible to calculate the interconnection delay $T_{w1}$ occurring on the interconnection 103b.

Moreover, the typical timing analysis tool can not calculate the delay $T_{g1}$ occurring in the repeater buffer 105. From the equation (1), the delay $T_{g1}$ is given by:

$$T_{g1}=f_1(T_{rf1}, R_2+R_4, C_3+C_4+C_{in2}).$$

This formula proves that the calculation of the delay $T_{g1}$ requires the waveform rounding parameter $T_{rf1}$ at the input terminal of the repeater buffer 105. As mentioned above, the waveform rounding parameter $T_{rf1}$ can not be calculated by the typical timing analysis tool. Thus, the typical timing analysis tool can not calculate the delay $T_{g1}$.

As mentioned above, the typical timing analysis tool can not carry out the timing analysis of the macro 101b without merging the top-level design data and the macro level design data.

It is desired to provide a method and system for improving efficiency of designing an integrated circuit by separately performing timing analysis on and the top-level hierarchical cell and the low-level hierarchical cell (the macro) while providing the interconnecting path to pass through the low-level hierarchical cell.

SUMMARY OF THE INVENTION

Therefore, an object of the present invention is to provide a method and system for improving efficiency of designing an integrated circuit by separately performing timing analysis on the low-level hierarchical cell (the macro) and the top-level hierarchical cell while providing the interconnecting path to pass through the low-level hierarchical cell.

In order to achieve an aspect of the present invention, a method of designing a layout of an integrated circuit includes:

(A) incorporating a macro in a top-level hierarchical cell; and (B) determining a layout of an interconnecting path provided in the top-level hierarchical cell, the interconnecting path transmitting a signal from a first position located outside the macro to a second position located outside the macro such that the interconnecting path passes through the macro. The interconnecting path includes:
  first and second buffers placed substantially on a boundary of the macro, an output of the first buffer being electrically connected to an input of the second buffer,
  a first interconnection connecting the first position to an input of the first buffer, and
  a second interconnection connecting an output of the second buffer to the second position.

Preferably, the method further includes:

(C) determining a first maximum allowed delay of the first interconnection;

(D) determining a second maximum allowed delay for transmitting the signal from the input of the first buffer to the output of the second buffer;

(E) determining a third maximum allowed delay of the second interconnection, the determining the layout of the interconnecting path including:

(F) determining a layout of the first interconnection such that a delay of the first interconnection is equal to or smaller than the first maximum allowed delay, (G) determining a layout inside the macro such that a delay needed for transmitting the signal from the input of the first buffer to the output of the second buffer is equal to or smaller than the second maximum allowed delay, and (H) determining a layout of the second interconnection such that a delay of the second interconnection is equal to or smaller than the third maximum allowed delay.

It is also preferable that the interconnecting path further includes a third interconnection connecting the output of the first buffer to the input of the second buffer, and that the determining the layout inside the macro is composed of:

(I) determining a layout of the third interconnection such that the delay needed for transmitting the signal from the input of the first buffer to the output of the second buffer is equal to or smaller than the second maximum allowed delay.

The determining the first, second and third maximum allowed delays is preferably composed of:

(J) determining a layout of a tentative interconnecting path connecting the first position to the second position, the tentative interconnecting path including:
  first and second tentative buffers placed inside the macro and substantially on the boundary of the macro,
  a first tentative interconnection connecting the first position to an input of the first tentative buffer,
  a second tentative interconnection connecting an output of the first tentative buffer to an input of the second tentative buffer,
  a third tentative interconnection connecting an output of the second tentative buffer to the second position, (K) calculating a tentative total delay of the tentative interconnecting path, (L) calculating a tentative inside delay needed for transmitting a signal from the input of the first tentative buffer to the output of the second tentative buffer, and (M) determining the second maximum allowed delay on the basis of the tentative total delay and the tentative inside delay.

The second maximum allowed delay is preferably determined by:

$$T_{C2}=T_C \cdot (T_2/T_0),$$

where $T_{C2}$ is the second maximum allowed delay, $T_C$ is a total maximum allowed delay of the interconnecting path, $T_2$ is the tentative inside delay, and $T_0$ is the tentative total delay.

The determining the layout inside the macro preferably includes:

(L) determining an arrangement of the first and second buffers such that the arrangement is identical to a tentative arrangement of the first and second tentative buffers, and (M) embedding the first and second buffers into the macro.

The determining the first, second and third maximum allowed delays is preferably further composed of:

(N) calculating a first tentative delay of the first tentative interconnection, (O) determining the first maximum allowed delay on the basis of the tentative total delay and the first tentative delay.

The first maximum allowed delay is preferably determined by:

$$T_{C1}=T_C \cdot (T_1/T_0),$$

where $T_{C1}$ is the first maximum allowed delay, $T_C$ is a total maximum allowed delay of the interconnecting path, $T_1$ is the first tentative delay, and $T_0$ is the tentative total delay.

The determining the first, second and third maximum allowed delays is preferably further composed of:

(P) calculating a second tentative delay of the third tentative interconnection, (Q) determining the third maximum allowed delay on the basis of the tentative total delay and the second tentative delay.

The third maximum allowed delay is preferably determined by:

$$T_{C3}=T_C \cdot (T_3/T_0),$$

where $T_{C3}$ is the third maximum allowed delay, $T_C$ is a total maximum allowed delay of the interconnecting path, $T_3$ is the third tentative delay, and $T_0$ is the tentative total delay.

In order to achieve another aspect of the present invention, a computer program is used for executing a method for designing a layout of an integrated circuit by a computer, the method comprising:

(A) incorporating a macro in a top-level hierarchical cell; and (B) determining a layout of an interconnecting path provided in the top-level hierarchical cell, the interconnecting path transmitting a signal from a first position located outside the macro to a second position located outside the macro such that the interconnecting path passes through the macro. The interconnecting path includes:

first and second buffers placed substantially on a boundary of the macro, an output of the first buffer being electrically connected to an input of the second buffer, a first interconnection connecting the first position to an input of the first buffer, and a second interconnection connecting an output of the second buffer to the second position.

In order to achieve still another aspect of the present invention, a computer assisted design system used for designing a layout of an integrated circuit is composed of an input unit receiving a net list And a processor responsive to the net list. The processor is programmed to incorporating a macro in a top-level hierarchical cell on the basis of the net list, and to determine a layout of an interconnecting path provided in the top-level hierarchical cell on the basis of the net list. The interconnecting path transmits a signal from a first position located outside the macro to a second position located outside the macro such that the interconnecting path passes through the macro. The interconnecting path includes first and second buffers placed substantially on a boundary of the macro, an output of the first buffer being electrically connected to an input of the second buffer, a first interconnection connecting the first position to an input of the first buffer, and a second interconnection connecting an output of the second buffer to the second position.

DESCRIPTION OF THE PREFERRED EMBODIMENTS

A method of designing an integrated circuit in a preferred embodiment of the present invention will be described below with reference to the attached drawings.

Figure 1A:
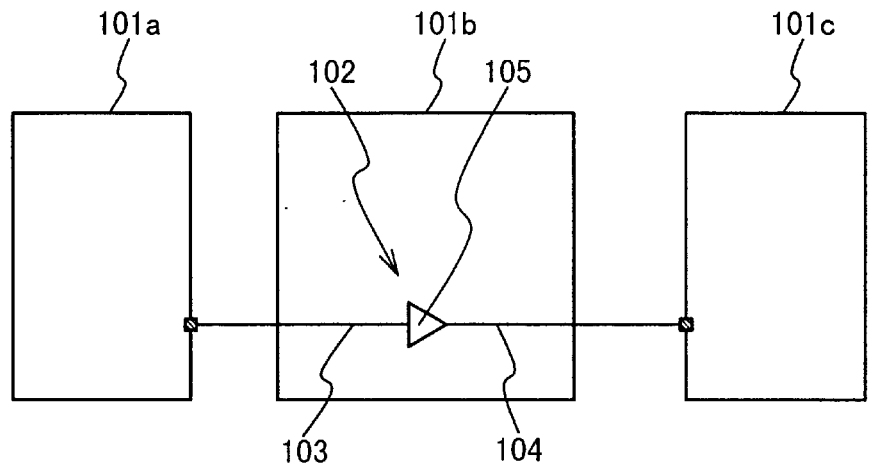
FIG. 1A shows a conventional hierarchical design method for designing an integrated circuit.
Figure 1B:
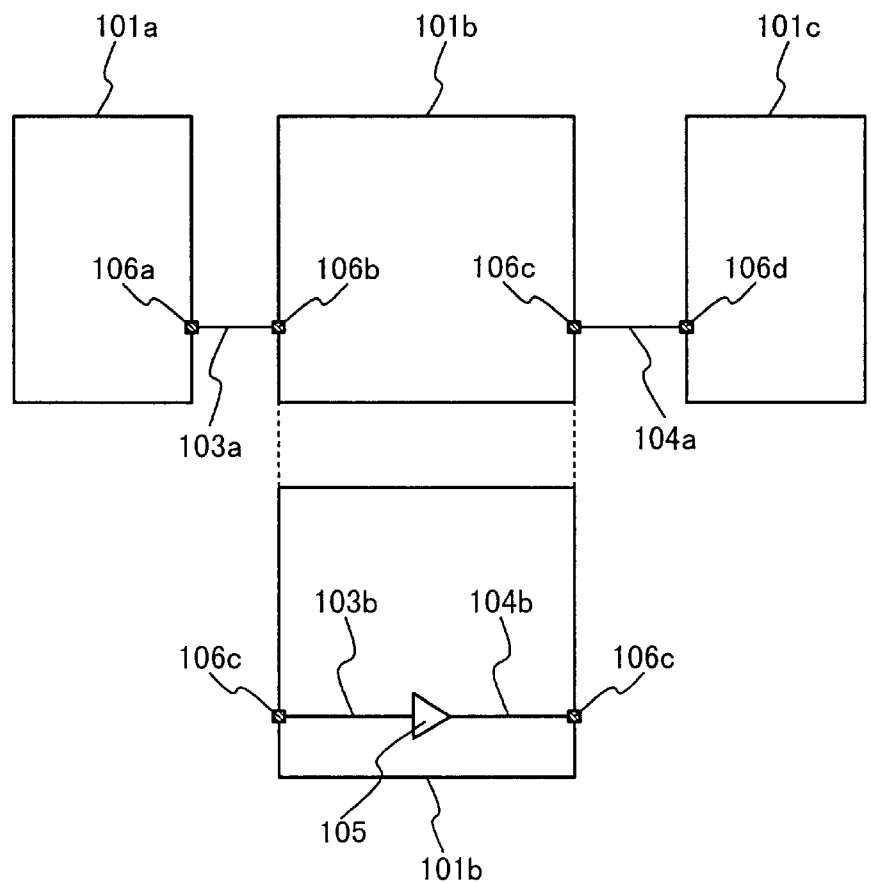
FIG. 1B shows the conventional hierarchical design method.
Figure 2:
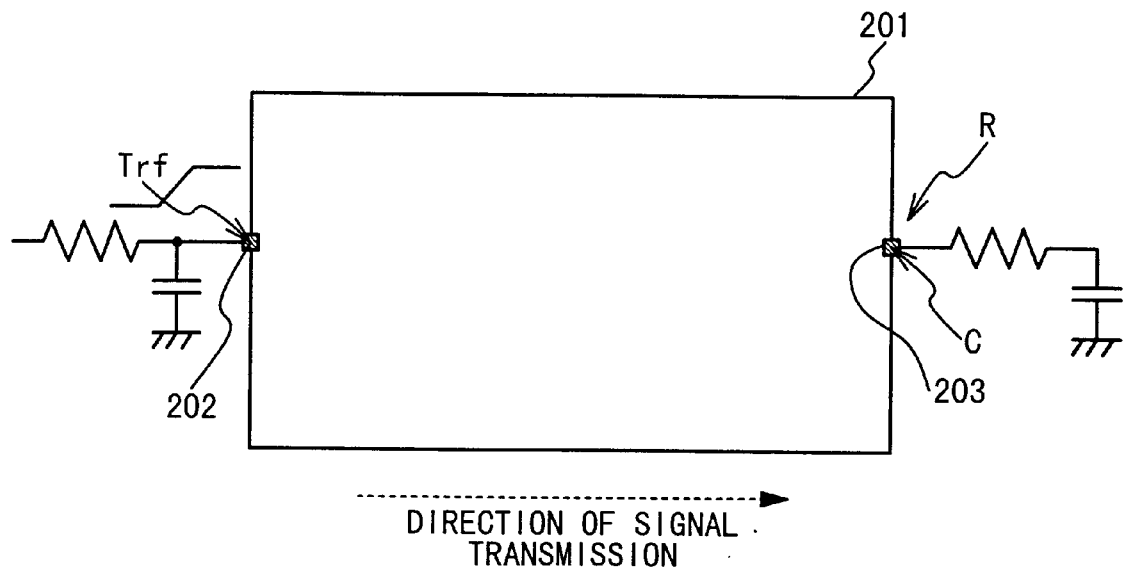
FIG. 2 is a schematic diagram describing a function of a typical timing analysis tool.
Figure 3:
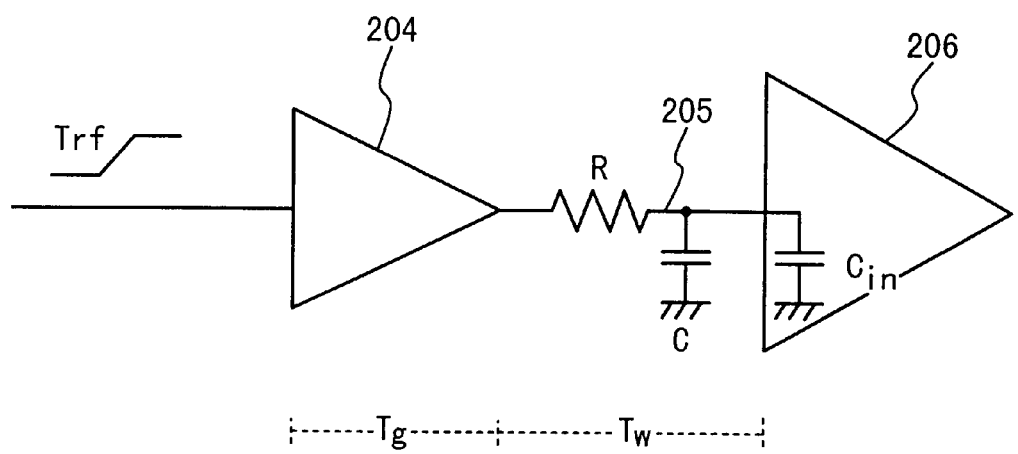
FIG. 3 is a schematic diagram describing a function of the typical timing analysis tool.
Figure 4:
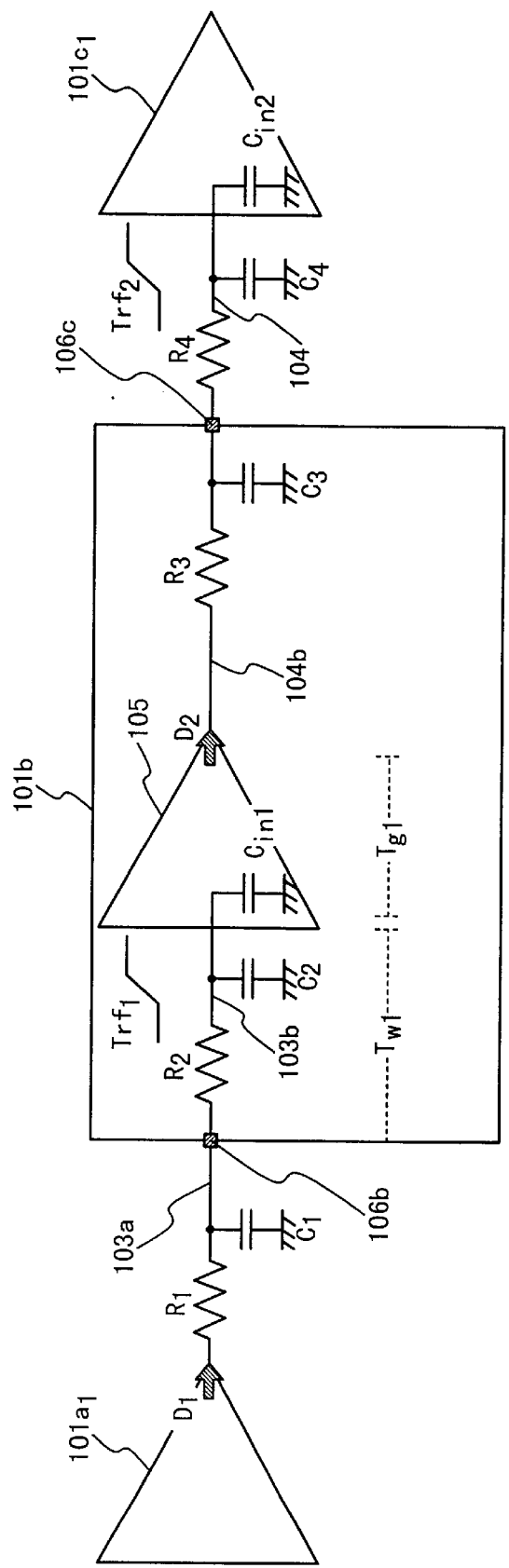
FIG. 4 is a schematic diagram for explaining a problem of the timing analysis by the typical timing analysis tool on an integrated circuit designed by the conventional hierarchical design method.
Figure 5:
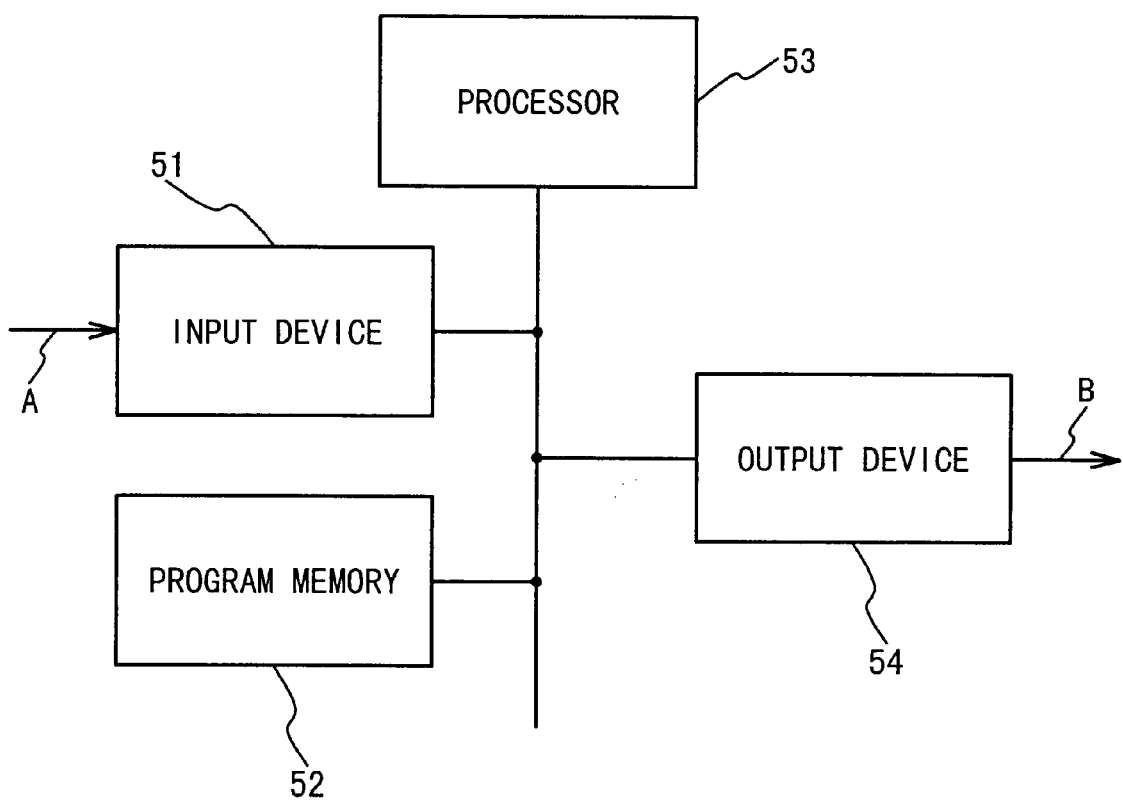
FIG. 5 shows a system for executing the hierarchical design method in a preferred embodiment.

FIG. 5 shows a system for designing integrated circuits in this embodiment. The system includes an input device 51, a program memory 52, a processor 53 and an output device 54. The input device 51 receives a net list A describing a structure of an integrated circuit. The program memory 52 stores therein a program to be carried out by the processor 53. The program describes a procedure of the designing method in this embodiment. The processor 53 executes the program stored in the program memory 52 to generate a layout B of the integrated circuit on the basis of the net list A. The output device 54 outputs the layout B.

Figure 6:
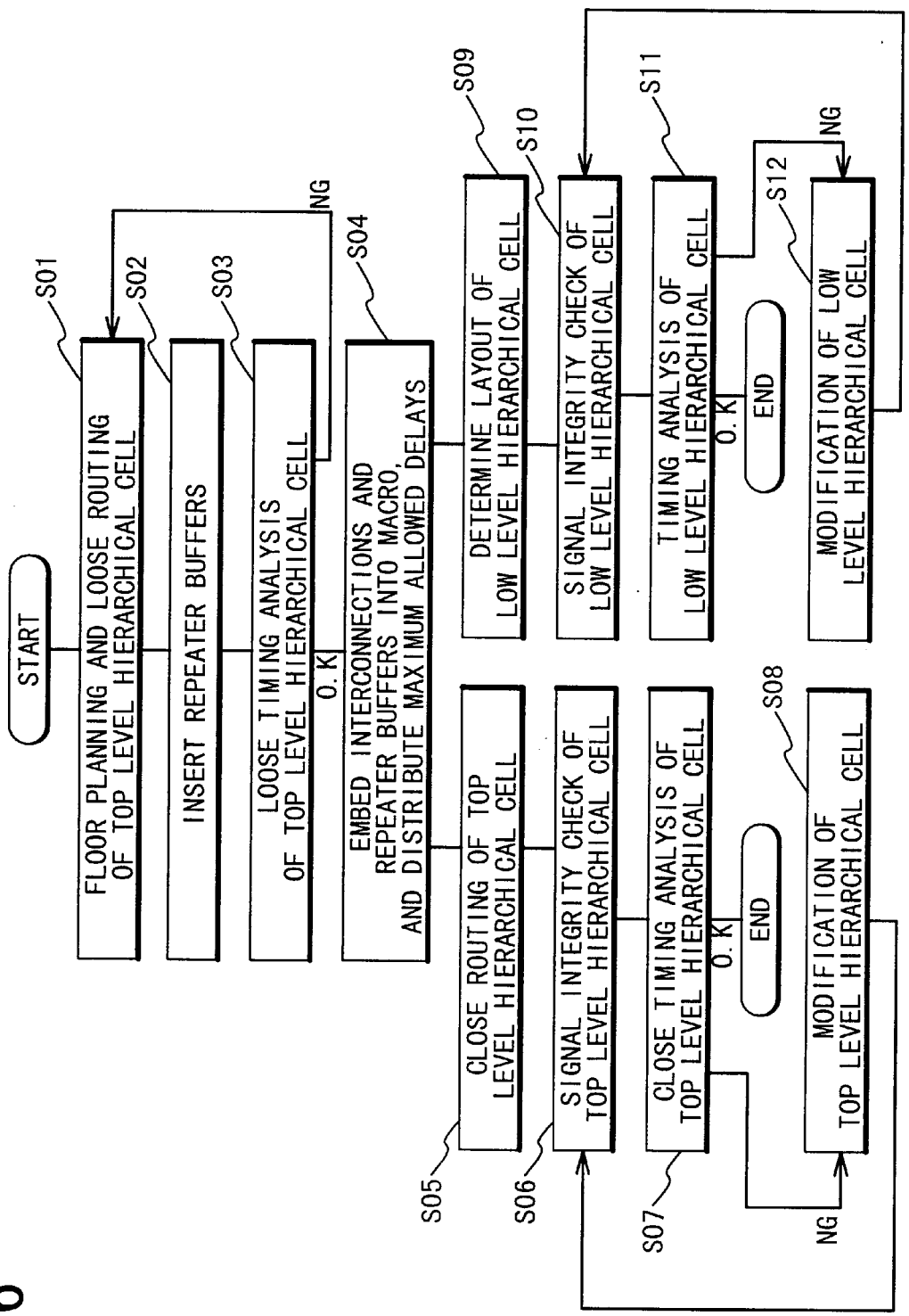
FIG. 6 is a flowchart showing a hierarchical design method in accordance with a preferred embodiment of the present invention.
Figure 7:
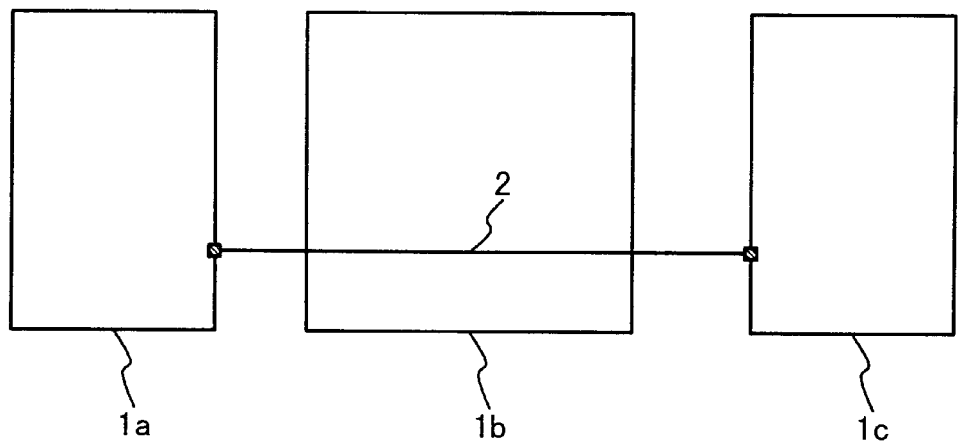
FIG. 7 shows floor planning and loose routing of a top-level hierarchical cell.

FIG. 6 is a flowchart showing the designing method in this embodiment. At first, floor planing and loose routing of a top-level hierarchical cell are performed (Step S01). As shown in FIG. 7, macros 1a, 1b and 1c and a tentative interconnection 2 are incorporated in the top-level hierarchical cell. Macros 1a, 1b and 1c may be referred to as low-level hierarchical cells. The macro 1a and the macro 1c are connected to each other through the tentative interconnection 2. The tentative interconnection 2 is placed so as to pass through the macro 1b.

Figure 8:
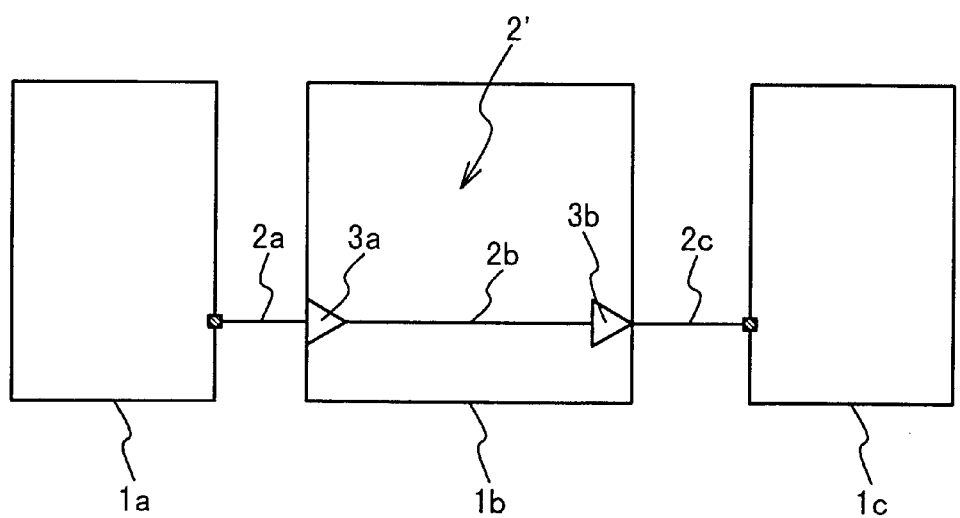
FIG. 8 shows a process for inserting repeater buffers 3a, 3b.

As shown in FIG. 6, insertion of repeater buffers are then executed (Step S02). As shown in FIG. 8, repeater buffers 3a, 3b are inserted into the tentative interconnection 2. The tentative interconnection 2 is divided into tentative interconnections 2a, 2b and 2c by the repeater buffers 3a, 3b. The tentative interconnection 2a bridges an output of the macro 1a and an input of the repeater buffer 3a. The tentative interconnection 2b bridges an output of the repeater buffer 3a and an input of the repeater buffer 3b. The tentative interconnection 2c is bridges an output of the repeater buffer 3b and the input of the macro 1c. The tentative interconnections 2a, 2b and 2c and the repeater buffers 3a, 3b constitute a tentative interconnecting path 2'.

The repeater buffers 3a is placed substantially on a boundary of the macro 1b so that a delay of the tentative interconnection inside the macro 1b is reduced to substantially 0.

Also, the repeater buffer 3b is placed substantially on the boundary of the macro 1b so that a delay of the tentative interconnection 2c inside the macro 1b is reduced to substantially 0.

Figure 9A:
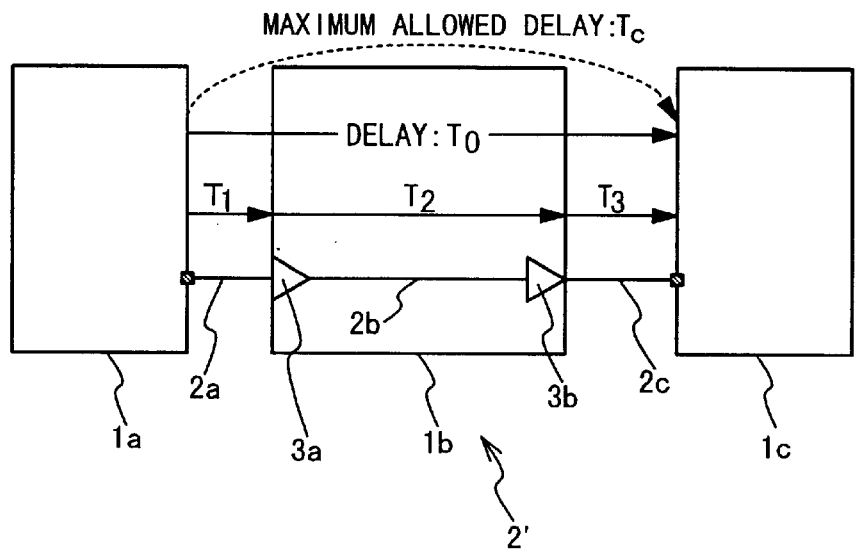
FIG. 9A shows a process for distributing maximum allowed delay.

As shown in FIG. 6, a first timing analysis is then performed on the top-level hierarchical cell (Step S03). With reference to FIG. 9A, the first timing analysis provides:

a delay $T_1$ of tentative interconnection 2a;

a delay $T_2$ taken for a signal to be transmitted from the input of the repeater buffer 3a to the output of the repeater buffer 3b through the tentative interconnection 2b; and a delay $T_3$ of the tentative interconnection 2c are calculated. The sum of the delays $T_1$, $T_2$ and $T_3$ is a total delay $T_0$ of the tentative interconnecting path 2'.

The total delay $T_0$ is then compared with a maximum allowed delay $T_C$ for the tentative interconnecting path 2'. If the delay $T_0$ is longer than the maximum allowed delay $T_C$, the floor planning and loose routing are modified, and then a timing analysis is executed again. That is, the operations at the steps S01, S02 are again carried out.

Figure 9B:
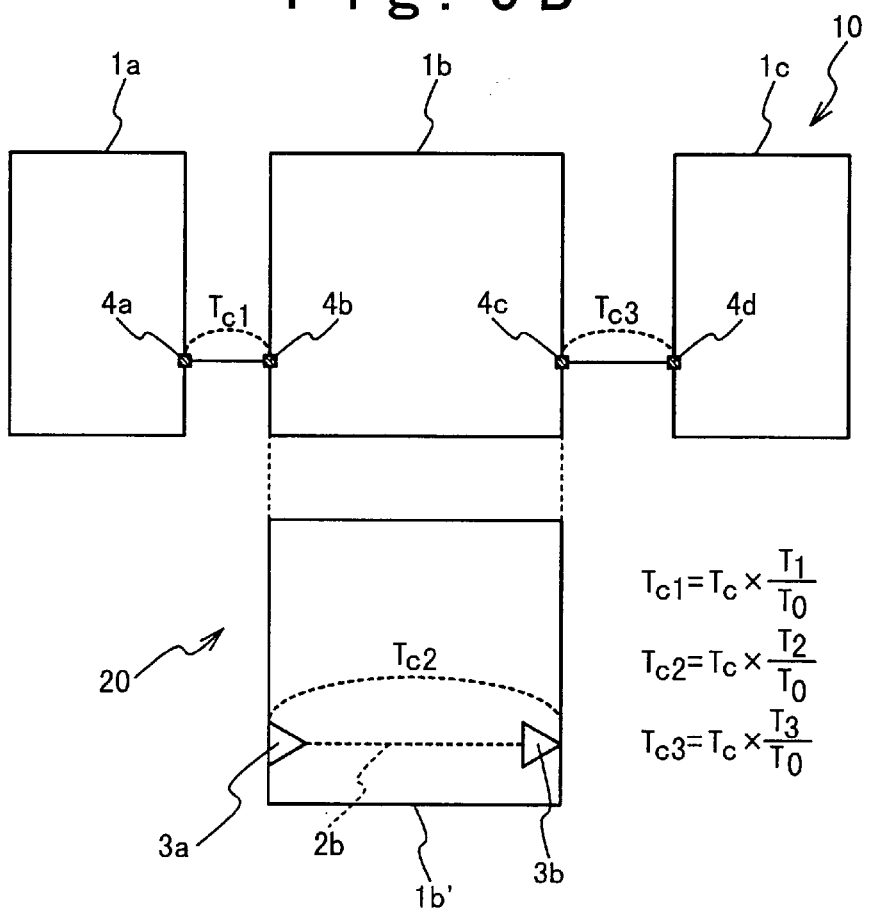
FIG. 9B shows a process for embedding a repeater buffer.

If the total delay $T_0$ is shorter than the maximum allowed delay $T_C$, a process for embedding the repeater buffers and distributing the maximum allowed delay is carried out (Step S04). The process for embedding the repeater buffer generates a top-level design data 10 and a macro level design data (a low-level design data) 20, as shown in FIG. 9B.

The top-level design data 10 includes the information necessary for the layout of the top-level hierarchical cell. In detail, the top-level design data 10 includes:

(1) the positions of the macros 1a, 1b and 1c;
(2) positions of the terminals 4a, 4b located at both ends of the tentative interconnection 2a;
(3) a driving ability $D_1$ of the buffer (not shown) which is located inside the macro 1a, for outputting a signal from the terminal 4a;
(4) a load capacitance connected to the terminal 4b, namely, a capacitance $C_{in1}$ of the input terminal of the repeater buffer 3a;
(5) connection information indicating that the terminals 4a, 4b are connected through the tentative interconnection 2a;
(6) positions of the terminals 4c, 4d located at both ends of the tentative interconnection 2b;
(7) a driving ability $D_3$ of the repeater buffer 3b connected to the terminal 4c;
(8) a capacitance $C_{in3}$ of the input terminal of the buffer (not shown) which is located inside the macro 1c and to which a signal is inputted from the terminal 4d; and
(9) the connection information indicating that the terminals 4c, 4d are connected through the interconnection.

The position of the terminal 4b coincides with the position of the input terminal of the repeater buffer 3a, and the position of the terminal 4c coincides with the position of the output terminal of the repeater buffer 3b.

The macro level design data 20 is used for the layout of the macro. The macro level design data 20 includes the information with regard to the repeater buffers 3a, 3b embedded in the macro and. In detail, the macro level design data 20 includes:

(1) the positions of the repeater buffers 3a, 3b in the macro 1b; and
(2) the connection information indicating that the repeater buffers 3a, 3b are connected through the interconnection 2b.

The maximum allowed delay $T_C$ of the tentative interconnecting path 2' is then divided to be distributed to the top-level hierarchical cell and the macro (or the low-level hierarchical cell). With respect to the top-level hierarchical cell, a maximum allowed delay $T_{C1}$ for the interconnection bridging the terminals 4a and 4b, and a maximum allowed delay $T_{C3}$ for the interconnection bridging the terminals 4c and 4d, are determined.

As shown in FIG. 9A, the maximum allowed delay $T_{C1}$ is defined by:

$$T_{C1}=T_C \cdot (T_1/T_0).$$

The maximum allowed delay $T_{C1}$ is defined so as to be proportional to the delay $T_1$ of the tentative interconnection 2a, which is given by the first timing analysis. The maximum allowed delay $T_{C3}$ is also defined by:

$$T_{C3}=T_C \cdot (T_3/T_0).$$

The maximum allowed delay $T_{C3}$ is defined so as to be proportional to the delay $T_3$ of the tentative interconnection 2c, which is given by the first timing analysis. The maximum allowed delay $T_{C1}$ and the maximum allowed delay $T_{C3}$ are used when the close routing is performed on the top-level hierarchical cell.

With regard to the macro (or the low-level hierarchical cell), the maximum allowed delay $T_{C2}$ allowed inside the macro 1b is defined by:

$$T_{C2}=T_C \cdot (T_2/T_0),$$

The maximum allowed delay $T_{C2}$ is defined so as to be proportional to the delay $T_2$ calculated as the generation inside the macro 1b, from the first timing analysis. The maximum allowed delay $T_{C2}$ is used for determining the layout of the macro.

The distribution of the maximum allowed delays to the top-level hierarchical cell and the macro enables to separately carry out the layout and the timing analysis of the top-level hierarchical cell and the macro.

Figure 10:
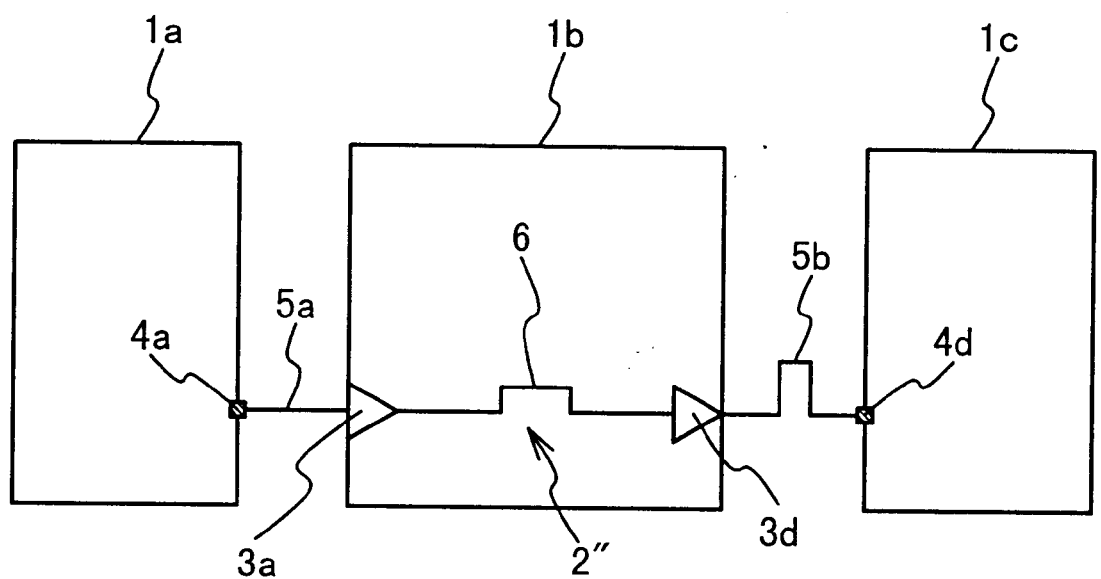
FIG. 10 shows a detailed interconnection of a high order layer.

As shown in FIG. 6, a close routing is performed on the top-level hierarchical cell on the basis of the top-level design data 10 (Step S05). The close routing generates the layout of the top-level hierarchical cell. As a result, the layouts of an interconnection 5a bridging the terminals 4a, 4b and an interconnection 5b bridging the terminals 4c, 4d are determined as shown in FIG. 10. The layouts of the interconnection 5a and the interconnection 5b may be different from the layouts of the tentative interconnection 2a and the tentative interconnection 2c. The layout of the interconnection 5a is determined such that the delay of the interconnection 5a is shorter than the maximum allowed delay $T_{C1}$. Similarly, the layout of the interconnection 5b is determined such that the delay of the interconnection 5b is shorter than the maximum allowed delay $T_{C3}$. Other interconnections are also laid on the top-level hierarchical cell to thereby generate the layout of the top-level hierarchical cell.

After the step S05, as shown in FIG. 6 (Step S06), a signal integrity check is performed on the top-level hierarchical cell on the basis of the layout of the top-level hierarchical cell.

The signal integrity check includes a crosstalk check, an electromigration check and a hot carrier check. The crosstalk check investigates crosstalk noises of the circuits included in the top-level hierarchical cell. The electromigration check investigates whether or not the electromigration may occur on the interconnections included in the top-level hierarchical cell. The hot carrier check investigates whether or not the deterioration by the hot carrier effect is induced in transistors connected to the interconnections of the top-level hierarchical cell.

Figure 11:
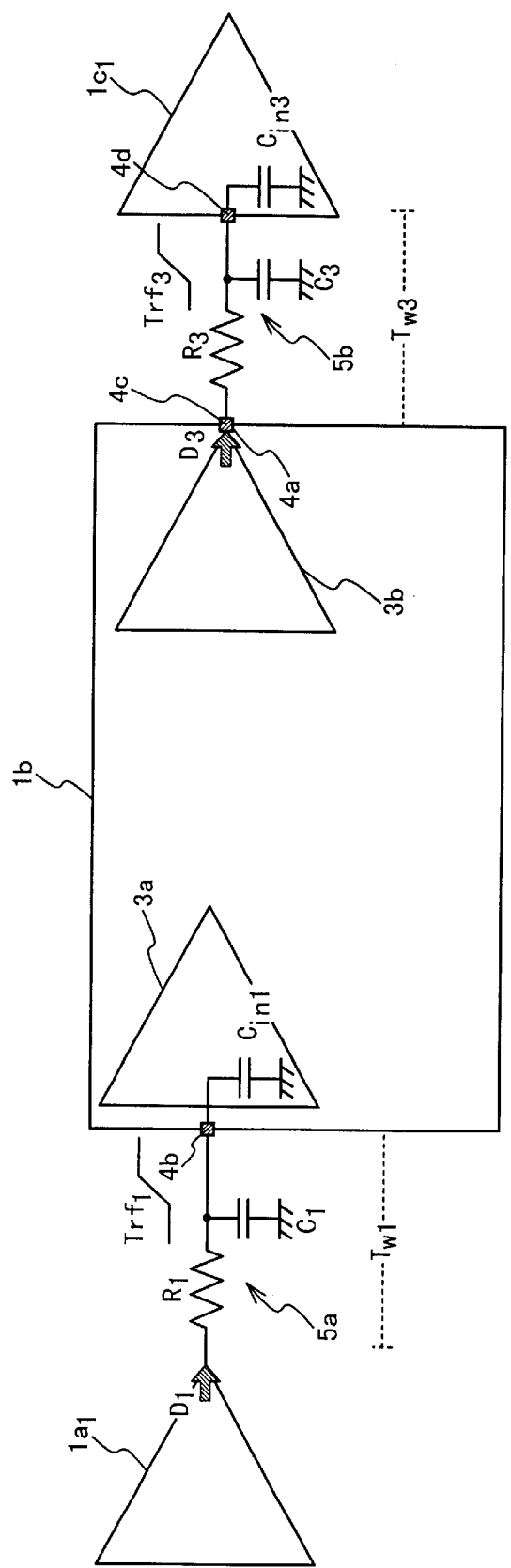
FIG. 11 shows a process for calculating delays of interconnections 5a, 5b.

The timing analysis is then performed on the top-level hierarchical cell on the basis of the top-level design data 10 and the layout of the top-level hierarchical cell (Step S07). The delays of the interconnection 5a and the interconnection 5b are calculated. FIG. 11 shows a process for calculating the delays of the interconnection 5a and the interconnection 5b.

A delay $T_{w1}$ of the interconnection 5a is calculated by the following equation:

$$T_{w1} = f_2(R_1, C_1 + C_{in1}) + T_{rf1},$$

where $f_2$ is a predetermined function, $R_1$ is the resistance of the interconnection 5a, $C_1$ is the capacitance of the interconnection 5a, $C_{in1}$ is the capacitance of the input terminal of the repeater buffer 3a, and $T_{rf1}$ is the waveform rounding parameter at the terminal 4a. The waveform rounding parameter $T_{rf1}$ is calculated by the equation:

$$T_{rf1} = f_3(D_1, R_1, C_1 + C_{in1}),$$

where $f_3$ is a predetermined function, and $D_1$ is a driving ability of a buffer $1a_1$ for outputting a signal to the terminal 4a located inside the macro 1a. The resistance $R_1$ and the capacitance $C_1$ are determined on the basis of the length of the interconnection 5a. The capacitance $C_{in1}$ and the driving ability $D_1$ are included in the top-level design data 10, as mentioned above.

Similarly, a delay $T_{w3}$ of the interconnection 5b is calculated by the following equation:

$$T_{w3} = f_2(R_3, C_3 + C_{in3}) + T_{rf3},$$

where $R_3$ is the resistance of the interconnection 5b, $C_3$ is the capacitance of the interconnection 5b, $C_{in3}$ is the capacitance of the input of the buffer $1c_1$, which is provided inside the macro 1b to receive the signal from the terminal 4d, and $T_{rf3}$ is the waveform rounding parameter at the terminal 4a. The waveform rounding parameter $T_{rf3}$ is calculated by the following equation:

$$T_{rf3} = f_3(D_3, R_3, C_3 + C_{in3}),$$

where $D_3$ is a driving ability of the repeater buffer 3b. The interconnection resistance $R_3$ and the capacitance $C_3$ are determined on the basis of the length of the interconnection 5b. The capacitance $C_{in3}$ and the driving ability $D_3$ are included in the top-level design data 10, as mentioned above.

The calculated delay $T_{w1}$ is then compared with the maximum allowed delay $T_{C1}$ determined for the interconnection 5a. If the delay $T_{w1}$ is longer than the maximum allowed delay $T_{C1}$, this proves that a timing error occurs.

Similarly, the calculated delay $T_{w3}$ is compared with the maximum allowed delay $T_{C3}$ determined for the interconnection 5b. If the delay $T_{w3}$ is longer than the maximum allowed delay $T_{C3}$, this proves that the timing error occurs.

The timing error check is also performed on the other portions of the top-level hierarchical cell.

If the timing error occurs, the layout of the top-level hierarchical cell is modified to eliminate the timing error(s), as shown in FIG. 6 (Step S08). The layouts of the interconnection 5a and the interconnection 5b and the other portions of the top-level hierarchical cell may be modified. The signal integrity check and the timing analysis are then performed again on the modified top-level hierarchical cell (Steps S06, S07).

On the other hand, When it is proved that the timing error does not occur, the layout of the top-level hierarchical cell is ended. As a result, the top-level hierarchical cell is designed such that the delays $T_{w1}$, $T_{w3}$ are shorter than the maximum allowed delays $T_{C1}$, $T_{C3}$ respectively.

Figure 12:
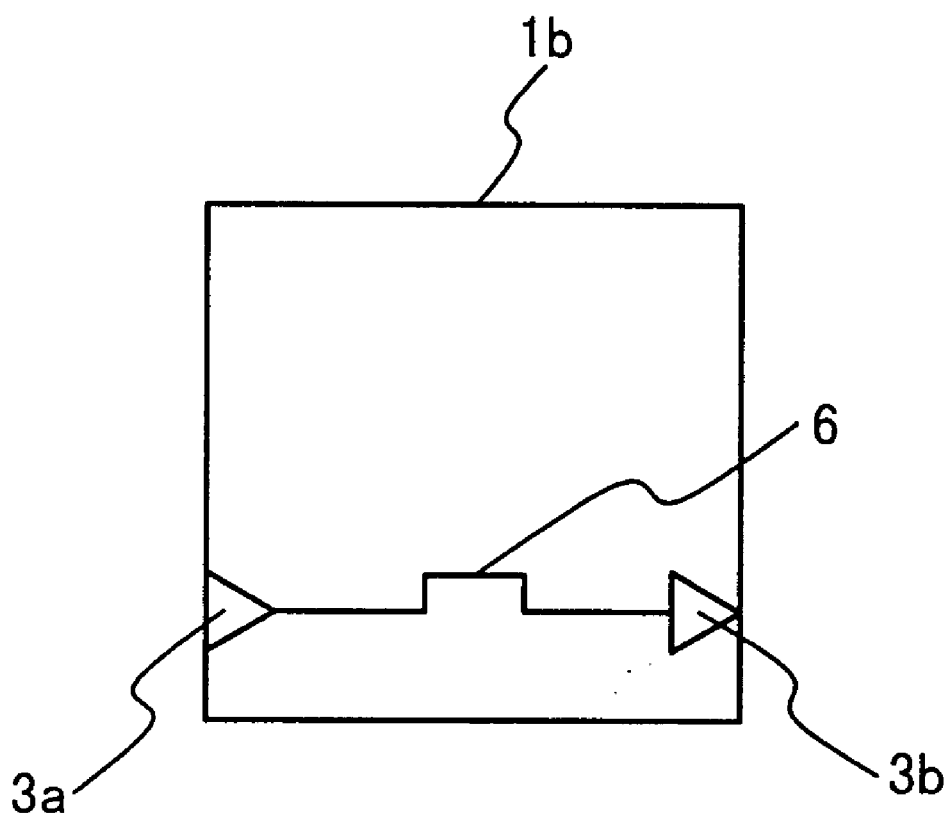
FIG. 12 shows a layout process of a macro.

In the meantime, the layout and the timing analysis are performed on the macro 1b. Firstly, as shown in FIG. 6, the layout of the macro 1b are generated on the basis of the macro level design data 20 (Step S09). As shown in FIG. 12, the repeater buffers 3a, 3b are embedded into the macro 1b during the generation of the layout of the macro 1b. The repeater buffers 3a, 3b are embedded such that the relative positions thereof with respect to the macro 1b are held. The layout of an interconnection 6 is then defined to bridge the repeater buffer 3a and the repeater buffer 3b. The layout of the interconnection 6 is carried out such that the delay taken for a signal to be transmitted from an input of the repeater buffer 3a to the output of the repeater buffer 3b through the interconnection 6 is shorter than the maximum allowed delay $T_{C2}$. The layout of the interconnection 6 does not always coincide with the layout of the tentative interconnection 2b. The interconnection 6 is also embedded into the macro 1b. The embedded repeater buffers 3a, 3b and the interconnection 6 constitutes a portion of the macro 1b.

After the step S09, a signal integrity check of the macro 1b is carried out on the basis of the layout of the macro 1b as shown in FIG. 6 (Step S10). The signal integrity check includes the crosstalk check, the electromigration check and the hot carrier check.

The timing analysis of the macros is then performed on the basis of the layout of the macro 1b (Step S11). The timing analysis of the macro 1b is achieved by a typical timing analysis tool, which calculates the delays of the macros on the basis of the waveform rounding parameters at the inputs of the macros, the resistance of the interconnection connected to the outputs of the macros and the load capacitance of the outputs of the macros.

Figure 13:
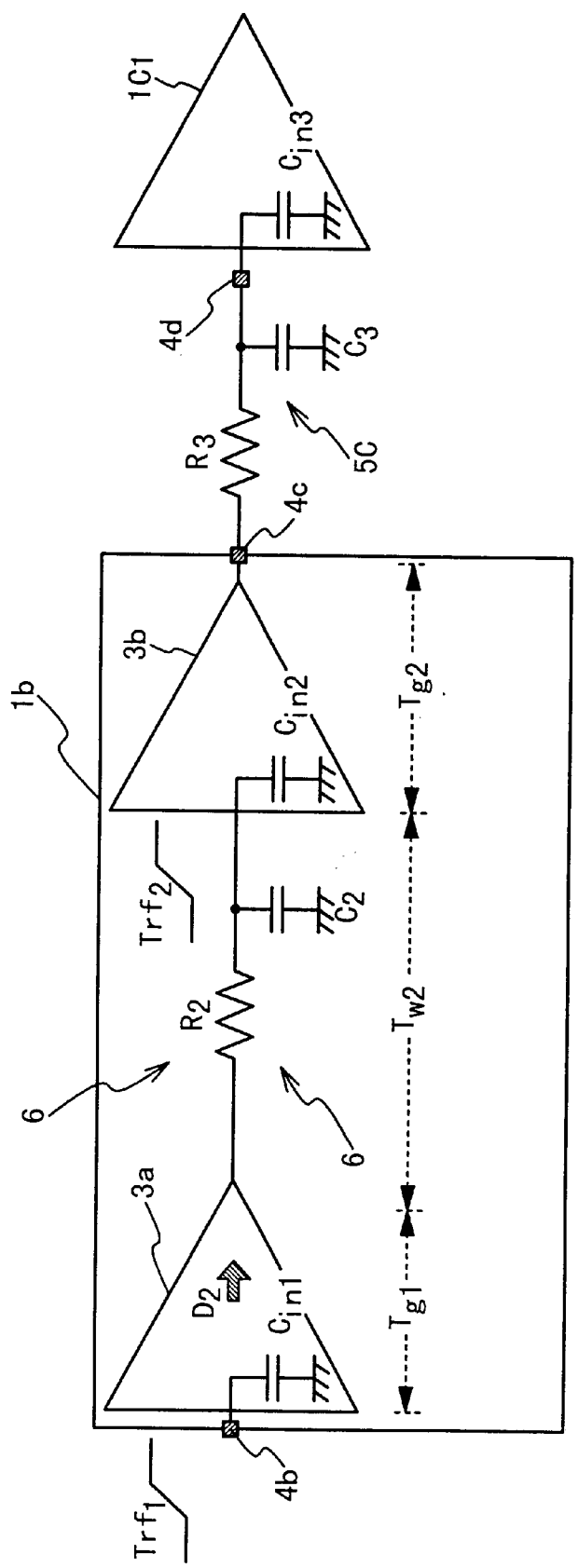
FIG. 13 shows a process for calculating a delay of a macro 1b.

The timing analysis at the step S07 gives the delays of the repeater buffer 3a, the interconnection 6 and the repeater buffer 3b. FIG. 13 shows the process for calculating the delays of the repeater buffer 3a, the interconnection 6 and the repeater buffer 3b.

A delay $T_{g1}$ of the repeater buffer 3a is calculated by the equation:

$$T_{g1}=f_1(T_{rf1}, R_2, C_2+C_{in2}),$$

where $f_1$ is a predetermined function, $T_{rf1}$ is the waveform rounding parameter at the terminal 4b, $R_2$ is the resistance of the interconnection 6, $C_2$ is the capacitance of the interconnection 6, and $C_{in2}$ is the capacitance of the input of the repeater buffer 3c. The waveform rounding parameter $T_{rf1}$ is equal to that calculated at the timing analysis of the top-level hierarchical cell (Step S07). The waveform rounding parameter $T_{rf1}$ is read in by the timing analysis tool, and used to calculate the delay $T_{g1}$. $R_2$ and $C_2$ are determined on the basis of the interconnection length of the interconnection 6.

A delay $T_{w2}$ of the interconnection 6 is calculated by the equation:

$$T_{w2}=f_2(R_2, C_2+C_{in2})+T_{rf2},$$

where $R_2$ is the resistance of the interconnection 6, $C_2$ is the capacitance of the interconnection 6, $C_{in2}$ is the capacitance of the input terminal of the repeater buffer 3b, and $T_{rf2}$ is the waveform rounding parameter at the input of the repeater buffer 3b. The waveform rounding parameter $T_{rf2}$ is calculated by:

$$T_{rf2}=f_3(D_2, R_2, C_2+C_{in2}),$$

where $D_2$ is the driving ability of the repeater buffer 3a.

A delay $T_{g2}$ of the repeater buffer 3b is calculated by the equation:

$$T_{g2}=f_1(T_{rf2}, R_3, C_3+C_{in3}),$$

where $T_{rf2}$ is the waveform rounding parameter at the input of the repeater buffer 3b, $R_3$ is the resistance of the interconnection 5b, $C_3$ is the capacitance of the interconnection 5b, and $C_{in3}$ is the capacitance of the input of the buffer $1c_1$ which is provided for the macro 1b to receive the signal from the terminal 4d. The resistance $R_3$, the capacitance $C_3$ and the capacitance $C_{in3}$ are extracted from the layout of the top-level hierarchical cell by the timing analysis tool.

The sum of the delays $T_{g1}$, $T_{w2}$ and $T_{g2}$ is calculated to be compared with the maximum allowed delay $T_{C2}$. If the sum of the delays $T_{g1}$, $T_{w2}$ and $T_{g2}$ is longer than the maximum allowed delay $T_{C2}$, it proves that the timing error occurs in the macro 1b.

Also, the timing error check is also performed on the other portions of the macro 1b.

When the timing error occurs, The layout of the interconnection 6 and/or the layout of the other portions of the macro 1b are modified to eliminate the timing error as shown in FIG. 6 (Step S12). The signal integrity check and the timing analysis are then again performed on the modified macro 1b (Steps S10, S11).

The modification of the layout of the interconnection 6 has no influence on the timing of the high level hierarchical cell outside the macro 1b because the repeater buffers 3a, 3b are incorporated substantially on the boundary of the macro 1b. Thus, the modification of the layout of the interconnection 6 does not request the timing analysis of the high level hierarchical cell. This enables to independently carry out the timing analysis only inside the macro 1b.

When it is proved that the timing error does not occur, the layout of the macro 1b is ended.

Figure 14:
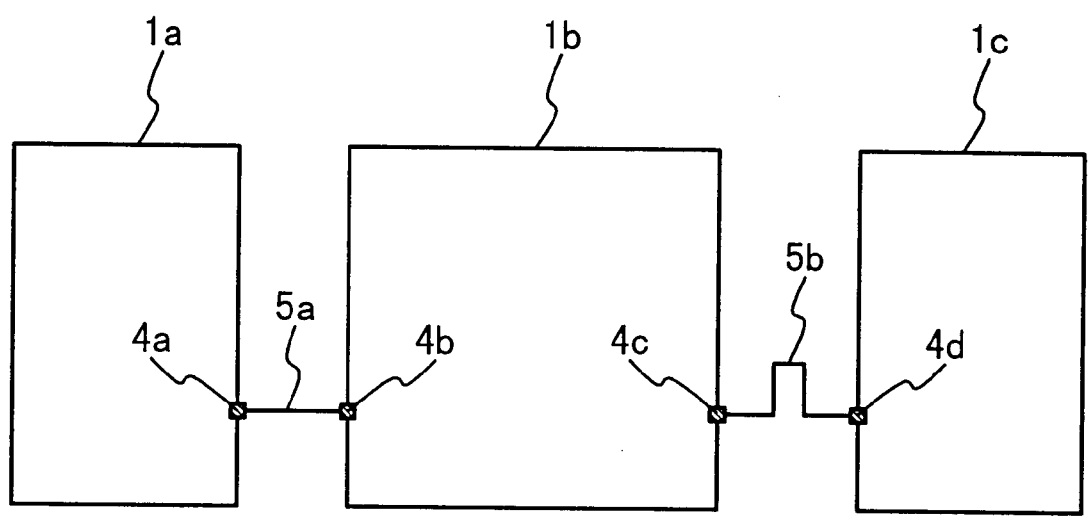
FIG. 14 shows a layout of a designed integrated circuit.

After the layouts of the high level hierarchical cell and the macro 1b are ended, the layouts of the high level hierarchical cell and the macros are merged to thereby generate the layout B of the integrated circuit. FIG. 14 shows the generated layout B. The interconnections 5a, 5b are placed outside the macro 1b. The repeater buffers 3a, 3b and the interconnection 6a are placed inside the macro 1b. The interconnection 5a is placed between the terminal 4a and the input of the repeater buffer 3a. The interconnection 5b is placed between the output of the repeater buffer 3a and the terminal 4d. The interconnection 6 is diffracted between the output of the repeater buffer 3a and the input of the repeater buffer 3b. The repeater buffers 3a is placed substantially on the boundary of the macro 1b, and thus the delay of the interconnections 5a inside the macro 1b is substantially 0. The repeater buffers 3a is placed substantially on the boundary of the macro 1b, and thus the delay of the interconnections 5a inside the macro 1b is substantially 0. The repeater buffers 3a, 3b and the interconnections 5a, 5b and the interconnection 6a constitute an interconnecting path 2" to transmit a transmission signal from the terminal 4a located outside the macro 1b to the terminal 4d.

As mentioned above, the designing method in this embodiment eliminates a necessity of merging the top-level design data of the high order layer and the macro level design data of the macro 1b before performing the timing analysis on the macro 1b. The elimination of the necessity of the merging the top-level design data and the macro level design data before the timing analysis effectively improves the efficiency of designing an integrated circuit.

Moreover, the repeater buffers 3a and 3b incorporated substantially on the boundary of the macro 1b eliminate the influence of the change in the layout of the interconnection 6 on the delays of the interconnections 5a, 5b. This eliminates the necessity of performing the timing analysis on the high level hierarchical cell after the modification of the layout of the macro 1b. The elimination of the necessity of performing the timing analysis on the high level hierarchical cell after the modification of the layout of the macro 1b also effectively improves the efficiency of designing an integrated circuit.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A method of designing a layout of an integrated circuit, comprising:
    (A) incorporating a macro in a top level hierarchical cell;
    (B) determining a layout of an interconnecting path provided in said top level hierarchical cell, said interconnecting path transmitting a signal from a first position located outside said macro to a second position located outside said macro such that said interconnecting path passes through said macro, wherein said interconnecting path includes:
  first and second buffers placed substantially on a boundary of said macro, an output of said first buffer being electrically connected to an input of said second buffer,
  a first interconnection connecting said first position to an input of said first buffer, and
  a second interconnection connecting an output of said second buffer to said second position,
(C) determining a first maximum allowed delay of said first interconnection;
(D) determining a second maximum allowed delay for transmitting said signal from said input of said first buffer to said output of said second buffer;
(E) determining a third maximum allowed delay of said second interconnection, wherein said determining said layout of said interconnecting path includes:
(F) determining a layout of said first interconnection such that a delay of said first interconnection is equal to or smaller than said first maximum allowed delay,
(G) determining a layout inside said macro such that a delay needed for transmitting said signal from said input of said first buffer to said output of said second buffer is equal to or smaller than said second maximum allowed delay, and
(H) determining a layout of said second interconnection such that a delay of said second interconnection is equal to or smaller than said third maximum allowed delay.

2. The method according to claim 1, wherein said interconnecting path further includes a third interconnection connecting said output of said first buffer to said input of said second buffer, and wherein
  said determining said layout inside said macro comprises:
    (I) determining a layout of said third interconnection such that said delay needed for transmitting said signal from said input of said first buffer to said output of said second buffer is equal to or smaller than said second maximum allowed delay.

3. The method according to claim 1, wherein said determining said first, second and third maximum allowed delays comprises:
  (J) determining a layout of a tentative interconnecting path connecting said first position to said second position, said tentative interconnecting path including:
    first and second tentative buffers placed inside said macro and substantially on said boundary of said macro,
    a first tentative interconnection connecting said first position to an input of said first tentative buffer,
    a second tentative interconnection connecting an output of said first tentative buffer to an input of said second tentative buffer,
    a third tentative interconnection connecting an output of said second tentative buffer to said second position,
  (K) calculating a tentative total delay of said tentative interconnecting path,
  (L) calculating a tentative inside delay needed for transmitting a signal from said input of said first tentative buffer to said output of said second tentative buffer, and
  (M) determining said second maximum allowed delay on the basis of said tentative total delay and said tentative inside delay.

4. The method according to claim 3, wherein said second maximum allowed delay is determined by:

$$T_{C2} = T_C \cdot (T_2/T_0),$$

where $T_{C2}$ is said second maximum allowed delay, $T_C$ is a total maximum allowed delay of said interconnecting path, $T_2$ is said tentative inside delay, and $T_0$ is said tentative total delay.

5. The method according to claim 3, wherein said determining said layout inside said macro includes:
  (L) determining an arrangement of said first and second buffers such that said arrangement is identical to a tentative arrangement of said first and second tentative buffers, and
  (M) embedding said first and second buffers into said macro.

6. The method according to claim 3, wherein said determining said first, second and third maximum allowed delays further comprises:
  (N) calculating a first tentative delay of said first tentative interconnection,
  (O) determining said first maximum allowed delay on the basis of said tentative total delay and said first tentative delay.

7. The method according to claim 6, wherein said first maximum allowed delay is determined by:

$$T_{C1} = T_C \cdot (T_1/T_0),$$

where $T_{C1}$ is said first maximum allowed delay, $T_C$ is a total maximum allowed delay of said interconnecting path, $T_1$ is said first tentative delay, and $T_0$ is said tentative total delay.

8. The method according to claim 3, wherein said determining said first, second and third maximum allowed delays further comprises:
  (P) calculating a second tentative delay of said third tentative interconnection,
  (Q) determining said third maximum allowed delay on the basis of said tentative total delay and said second tentative delay.

9. The method according to claim 8, wherein said third maximum allowed delay is determined by:

$$T_{C3} = T_C \cdot (T_3/T_0),$$

where $T_{C3}$ is said third maximum allowed delay, $T_C$ is a total maximum allowed delay of said interconnecting path, $T_3$ is said third tentative delay, and $T_0$ is said tentative total delay.

10. A computer program used for executing a method for designing a layout of an integrated circuit by a computer, said method comprising:
  (A) incorporating a macro in a top level hierarchical cell;
  (B) determining a layout of an interconnecting path provided in said top level hierarchical cell, said interconnecting path transmitting a signal from a first position located outside said macro to a second position located outside said macro such that said interconnecting path passes through said macro,
  wherein said interconnecting path includes:
    first and second buffers placed substantially on a boundary of said macro, an output of said first buffer being electrically connected to an input of said second buffer,
    a first interconnection connecting said first position to an input of said first buffer, and
    a second interconnection connecting an output of said second buffer to said second position, (C) determining a first maximum allowed delay of said first interconnection;

(D) determining a second maximum allowed delay for transmitting said signal from said input of said first buffer to said output of said second buffer;

(E) determining a third maximum allowed delay of said second interconnection, wherein said determining said layout of said interconnecting path includes:

(F) determining a layout of said first interconnection such that a delay of said first interconnection is equal to or smaller than said first maximum allowed delay, (G) determining a layout inside said macro such that a delay needed for transmitting said signal from said input of said first buffer to said output of said second buffer is equal to or smaller than said second maximum allowed delay, and (H) determining a layout of said second interconnection such that a delay of said second interconnection is equal to or smaller than said third maximum allowed delay.

11. The computer program according to claim 10, wherein said interconnecting path further includes a third interconnection connecting said output of said first buffer to said input of said second buffer, and wherein said determining said layout inside said macro comprises:

(I) determining a layout of said third interconnection such that said delay needed for transmitting said signal from said input of said first buffer to said output of said second buffer is equal to or smaller than said second maximum allowed delay.

12. The method according to claim 10, wherein said determining said first, second and third maximum allowed delays comprises:

(J) determining a layout of a tentative interconnecting path connecting said first position to said second position, said tentative interconnecting path including:
first and second tentative buffers placed inside said macro and substantially on said boundary of said macro,
a first tentative interconnection connecting said first position to an input of said first tentative buffer,
a second tentative interconnection connecting an output of said first tentative buffer to an input of said second tentative buffer,
a third tentative interconnection connecting an output of said second tentative buffer to said second position, (K) calculating a tentative total delay of said tentative interconnecting path, (L) calculating a tentative inside delay needed for transmitting a signal from said input of said first tentative buffer to said output of said second tentative buffer, and (M) determining said second maximum allowed delay on the basis of said tentative total delay and said tentative inside delay.

13. A computer assisted design system used for designing a layout of an integrated circuit comprising:

an input unit receiving a net list;

a processor programmed to incorporate a macro in a top level hierarchical cell on the basis of said net list, and to determine a layout of an interconnecting path provided in said top level hierarchical cell on the basis of said net list, wherein said interconnecting path transmits a signal from a first position located outside said macro to a second position located outside said macro such that said interconnecting path passes through said macro, and wherein said interconnecting path includes:
first and second buffers placed substantially on a boundary of said macro, an output of said first buffer being electrically connected to an input of said second buffer,
a first interconnection connecting said first position to an input of said first buffer, and
a second interconnection connecting an output of said second buffer to said second position, wherein said design system performing:
determining a first maximum allowed delay of said first interconnection;
determining a second maximum allowed delay for transmitting said signal from said input of said first buffer to said output of said second buffer;
determining a third maximum allowed delay of said second interconnection, wherein said determining said layout of said interconnecting path includes:
determining a layout of said first interconnection such that a delay of said first interconnection is equal to or smaller than said first maximum allowed delay,
determining a layout inside said macro such that a delay needed for transmitting said signal from said input of said first buffer to said output of said second buffer is equal to or smaller than said second maximum allowed delay, and
determining a layout of said second interconnection such that a delay of said second interconnection is equal to or smaller than said third maximum allowed delay.

* * * * *